United States Patent
Galan

(10) Patent No.: US 7,689,187 B2
(45) Date of Patent: Mar. 30, 2010

(54) DUAL INPUT LOW NOISE AMPLIFIER FOR MULTI-BAND OPERATION

(75) Inventor: Ariel J. Galan, Pembroke Pines, FL (US)

(73) Assignee: Motorola, Inc., Schaumburg, IL (US)

( * ) Notice: Subject to any disclaimer, the term of this patent is extended or adjusted under 35 U.S.C. 154(b) by 545 days.

(21) Appl. No.: 11/680,754

(22) Filed: Mar. 1, 2007

(65) Prior Publication Data

US 2008/0211586 A1 Sep. 4, 2008

(51) Int. Cl.
*H04B 1/18* (2006.01)
*H04B 7/08* (2006.01)

(52) U.S. Cl. .................. 455/188.1; 455/132; 455/168.1

(58) Field of Classification Search ............. 455/552.1, 455/550.1, 130, 132, 133, 168.1, 188.1, 291, 455/293; 330/278, 285, 302
See application file for complete search history.

(56) References Cited

U.S. PATENT DOCUMENTS

| 3,727,140 | A | | 4/1973 | Rodrigalvarez Nieto et al. |
| 5,794,159 | A | * | 8/1998 | Portin ..................... 455/553.1 |
| 6,657,498 | B2 | * | 12/2003 | Park et al. .................. 330/285 |
| 6,804,261 | B2 | * | 10/2004 | Snider ........................ 370/478 |
| 7,299,020 | B2 | * | 11/2007 | Shen et al. ............... 455/188.1 |
| 7,444,167 | B2 | * | 10/2008 | Chang et al. ............. 455/553.1 |
| 7,486,135 | B2 | * | 2/2009 | Mu .............................. 330/51 |

| 2006/0012442 | A1 | 1/2006 | Shinbo et al. |

FOREIGN PATENT DOCUMENTS

| DE | 1053588 B | 3/1959 |
| DE | 1099590 B | 2/1961 |
| WO | WO2005088849 A1 | 9/2005 |

OTHER PUBLICATIONS

PCT International Search Report Application No. PCT/US2008/054058 Dated July 2, 2008—29 Pages.
Sunderarajan S Mohan et al: Bandwidth Extension in CMOS With Optimized On-Chip Inductors, Mar. 2000.
Bo Shi et al: A CMOS Receiver Front-End for 3.1-10.6 GHZ Ultra-Wideband Radio, Sep. 2006.

* cited by examiner

*Primary Examiner*—Sonny Trinh
(74) *Attorney, Agent, or Firm*—Barbara R. Doutre

(57) ABSTRACT

A dual input low noise amplifier (LNA) for multi-band frequency operation is disclosed. The dual input LNA (100) simultaneously operates in two amplifier configurations for the two inputs (101 and 103), of a first frequency band and a second frequency band, to produce a common output (113). Matching networks (102 and 104) receive and pass the inputs (101 and 103) to a transistor device (106). The transistor device is coupled to a series resonant circuit (108) at a first input node (107) to ground AC signal energy from a second input node (109) of the transistor device. The grounding causes the transistor device to simultaneously amplify and combine the signals at the first and the second input nodes to produce the common output of the first frequency band and the second frequency band at a common output node (111) of the transistor device.

23 Claims, 8 Drawing Sheets

DUAL INPUT LOW NOISE AMPLIFIER FOR MULTI-BAND OPERATION

FIELD OF THE INVENTION

The present invention generally relates to low noise amplifiers (LNAs), and more specifically to a dual input LNA for multi-band frequency operation.

BACKGROUND

Low noise amplifiers (LNAs) are widely used in front-end receivers in various wireless communication devices. These LNA devices are used for boosting power of received signals without introducing significant noise or distortion on the received signals. LNAs are variously coupled to other front-end receiver components, such as antennas, preselectors, mixers and switching networks, in different configurations for different receiver architectures. The use and topology of LNAs, and the receiver architecture within which the LNAs are integrated, vary for various communication devices, such as two-way radios, mobile radios and cell phones.

The ability for communication devices to communicate over several frequency bands is becoming increasingly prevalent. Present multi-band receivers utilize band select switches, in conjunction with LNAs and preselectors, to select a signal of particular frequency band for demodulation. Some receivers support as many as five bands (VHF, UHF1, UHF2, 700 MHz and 800 MHz) which can result in excessive loss due to the required switching. These losses can degrade receiver sensitivity and may result in intermodulation distortion. Furthermore, the receivers utilizing band select switches cannot be used to simultaneously demodulate signals of different frequency bands. Parts count, board area, power consumption, controller and logic complexity, and cost also present challenges when designing multi-band receivers.

Approaches have been suggested to overcome the utilization of band select switches. A resistive combiner may be used instead of switches to combine signals of different frequency bands from LNAs. While the resistive combiner reduces the logic complexity, it also results in front-end insertion loss and receiver sensitivity degradation. Additionally, using the resistive combiner, instead of a band select switch, does not significantly reduce the parts count or board area of a communication device.

Accordingly, it would be desirable to have an LNA capable of providing multi-band frequency operation without the aforementioned issues.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
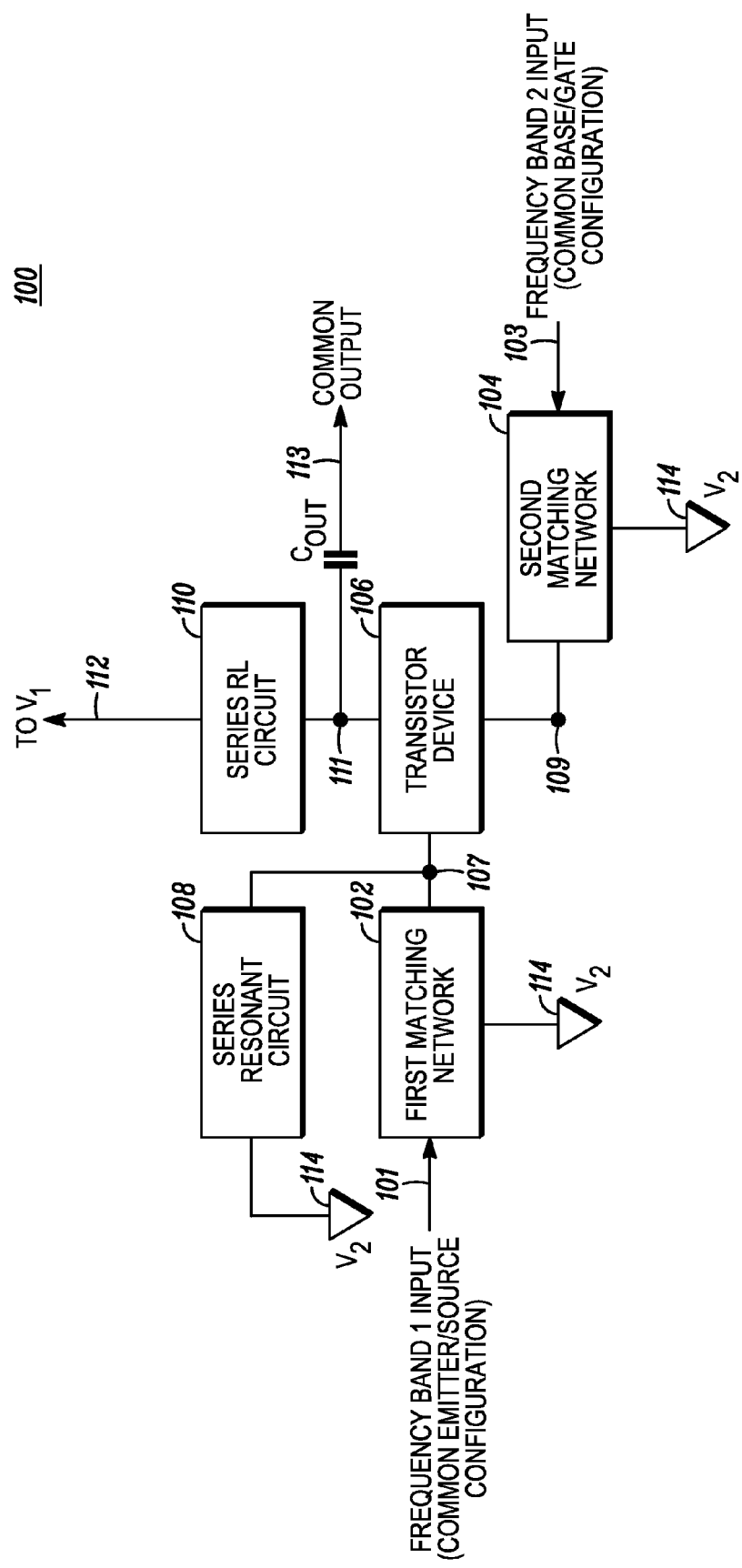
FIG. 1 is a block diagram illustrating a dual input low noise amplifier (LNA) in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in a dual input Low noise amplifier (LNA) for amplifying and switchlessly combining signals of different frequency band. The dual input LNA of the present invention provides a dual-band signal which can be utilized in a demodulator block for a multi-band receiver. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Briefly, in accordance with the present invention, there is provided herein a dual input LNA for amplifying and switchlessly combining signals of different frequency band. The dual input LNA formed in accordance with the present invention includes a transistor device, wherein two input nodes of the transistor device receive input signals of different frequency bands. A series resonant circuit is coupled to one of the input nodes for grounding alternate current (AC) signal energy from the frequency band received at the other input node. Consequently, a dual, simultaneous amplifier configuration is realized and the transistor device simultaneously amplifies the received input signals and provides a common dual-band output at a third node, also referred to as a common output node, of the transistor device. The common dual-band output signal eliminates the requirement for switching between signals of different frequency bands for demodulation. Furthermore, a method and receiver utilizing the dual input LNA are provided.

FIG. 1 is a block diagram illustrating a dual input LNA 100 in accordance with some embodiments of the invention. The dual input LNA 100 is preferably incorporated within a multi-band receiver (not shown). A first signal 101 of a first frequency band and a second signal 103 of second frequency band, such as RF signals of different frequency bands, provide inputs for the dual input LNA 100. The dual input LNA 100 provides an output signal 113 of the first frequency band and the second frequency band as a common output to a demodulator block for a multi-band receiver. Hence, the dual input LNA 100 may be incorporated within the multi-band receiver to simultaneously amplify and combine the first signal 101 and the second signal 103 thereby eliminating the need for a band select switch.

The dual input LNA 100 includes a first circuit henceforth referred to as first matching network 102, a second circuit henceforth referred to as second matching network 104, a transistor device 106, and a series resonant circuit 108. At the input for the dual input LNA, the first signal 101 is provided to the first matching network 102 and simultaneously, the second signal 103 is provided to the second matching network 104. The first matching network 102 is coupled to a first node 107 of the transistor device 106 and the second matching network 104 is coupled to a second node 109 of the transistor device 106. The series resonant circuit is coupled to the first node 107 of the transistor device 106. The output signal 113 is an output at a third node 111 (also referred to as a common output node) of the transistor device 106. The dual input LNA 100 further comprises series resistor inductor (RL) circuit 110 (also referred to as a broadband biasing circuit), and an output capacitor $C_{OUT}$. The series RL circuit 110 is coupled to the third node 111. The output capacitor is also coupled to the third node 111 thereby providing the output signal 113 at the common output of the dual input LNA 100.

Operationally, the first matching network 102 is configured for receiving and passing the first signal 101 to the first node 107 of the transistor device 106. The second matching network 104 is configured for receiving and passing the second signal 103 to the second node 109 of the transistor device 106. The first and the second matching networks, 102 and 104, are configured to simultaneously provide an input impedance match and an optimum noise match for the inputs of the first and the second frequency bands respectively. As a result of the input impedance matching and optimal noise match by the matching networks, the desired return loss, isolation, and noise figure values are obtained at the first and the second nodes, 107 and 109. A more detailed discussion of the return loss, isolation, and noise figure values is provided in the discussion of FIGS. 5 through 8.

Hence, the first signal 101 is received at the first node 107 and the second signal 103 is received at the second node 109. Subsequently, a portion of the alternating current (AC) signal energy of the second signal 103 of the second frequency band is passed to the first node 107. The series resonant circuit 108 which is coupled between first node 107 of the transistor device 106 and an AC ground 114 is configured to have resonant frequency within the second frequency band. As a result, the first node of the transistor is tied to a common power rail, or in other words the AC ground 114. The series resonant circuit 108 effectively and exclusively grounds alternating current (AC) signal energy of the second frequency band at the first node 107.

The first signal 101 is amplified as the transistor device 106 operates as a transistor amplifier with a common node configuration for the input at the first node 107. The transistor device 106 is designed to simultaneously operate as a transistor amplifier with a common node configuration for the input at the second node 109. Amplified output signals for the two common node configurations appear at the third node 111 of the transistor device 106 and thus, are combined to form the output signal 113 of the first and the second frequency band. Hence, the transistor device 106 operates as a switchless device which simultaneously amplifies and combines inputs at the first node and the second node to produce the output signal 113.

Furthermore the series RL circuit 110 is coupled between a DC biasing source $V_1$ to provide a resistive load at the third node 111. Hence the series RL circuit 110 results in stable output impedance over a wide frequency range for the output signal 113. The output capacitor $C_{OUT}$ blocks the direct current (DC) component of the output signal 113 and provides the output signal 113 at the common output of the dual input LNA.

In the described embodiments, the matching networks 102 and 104 may be circuits with capacitors, resistors and inductors designed to provide the input impedance match for particular frequency bands. In the described embodiments, the series resonant circuit 108 may be a series inductor capacitor (LC) resonant circuit configured to have a resonant frequency within the second frequency band. Similarly, the transistor device 106 may be a bipolar junction device (BJT) or a field effect transistor (FET). Additionally, the transistor device 106 may be an N-type (NPN or NMOS) device or a P-type (PNP or PMOS) device. The potential for DC biasing sources $V_1$ and $V_2$ depends upon the type (a N-type or a P-type) of the transistor device used.

Figure 2:
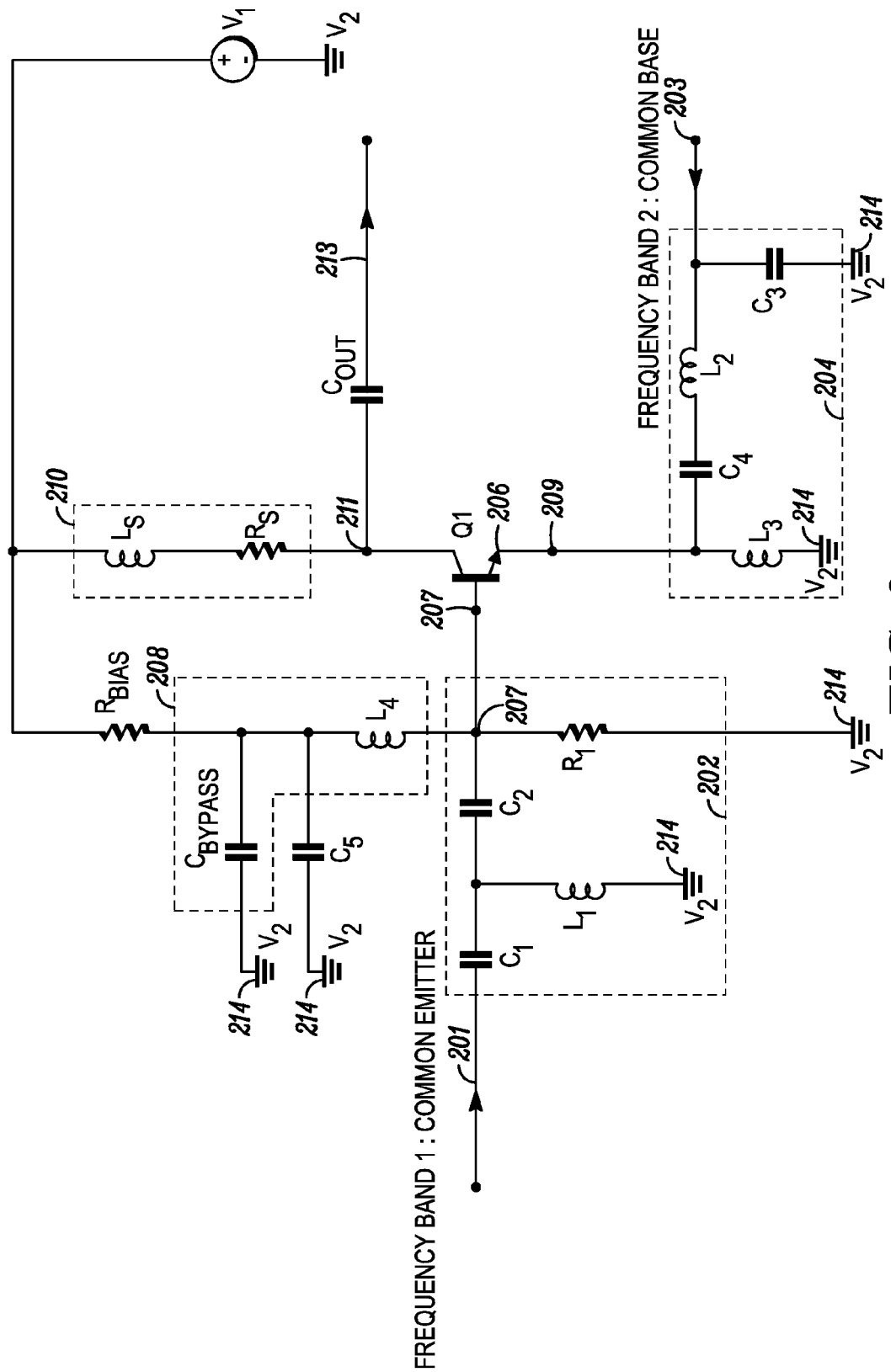
FIG. 2 is a circuit schematic diagram illustrating the dual input LNA combiner in accordance with some embodiments of the invention.

FIG. 2 is a circuit schematic diagram illustrating the dual input LNA in accordance with some embodiments of the invention. In the illustrated embodiment of the dual input LNA 200, a transistor device 206 is an NPN device Q1 with a base 207, an emitter 209, and a collector 211. A first matching network 202 is provided which includes capacitors $C_1$ and $C_2$, an inductor $L_1$, and a resistor $R_1$. The capacitors $C_1$ and $C_2$, the inductor $L_1$ and resistor $R_1$ are variously coupled and designed to provide input impedance match and optimum noise match for a first input 201 of the first frequency band. Similarly, a second matching network 204 is provided which includes capacitors $C_3$ and $C_4$, inductors $L_3$, and $L_4$. The capacitors $C_3$ and $C_4$, and the inductors $L_3$ and $L_4$ are variously coupled and designed to provide input impedance match and optimum noise match for a second input 203 of the second frequency band. A series resonant circuit 208 is also provided which includes a capacitor $C_{BYPASS}$ and an inductor $L_4$ series connected between the base and an AC ground 214. The dual input LNA 200 also includes the series RL circuit 210 (a resistor $R_S$ and an inductor $L_S$), a biasing resistor $R_{BIAS}$, the output capacitor $C_{OUT}$, a bypass capacitor $C_5$ and the DC biasing sources $V_1$ and $V_2$ ($V_2$ being 0 volts for NPN).

Operationally, the first matching network 202 provides the first input 201 to the base 207 of $Q_1$ and simultaneously, the second matching network 204 provides the second input 203 to the emitter 209 of $Q_1$. The series resonant circuit 208 AC grounds the base as the resonant frequency of the series connected $L_4$ and $C_{BYPASS}$ is within the second frequency band. As a result, the first input 201 sees a common emitter configuration, and the second input 203 sees a common base configuration. Both common emitter and common base configurations operate simultaneously to provide a common output 213 at the collector 211. Hence, $Q_1$ operates as a common emitter amplifier for the first input 201 at the base 207 and as a common base amplifier for the second input 203 at the emitter 209 causing $Q_1$ to produce the common output 213 at the collector.

Operationally, the dual input LNA 200 includes the series RL circuit 210 ($R_S$ and $L_S$) which is used as a resistive load for equalizing the output impedance versus frequency at the collector and providing a stable gain over a wide range of frequencies. For instance, in a case where the inputs are in the Very High Frequency (VHF) band of 150-200 MHz and Radio Frequency band of around 800 MHz, the series RL circuit 210 is ideally designed to provide stable output impedance over a range from 50 MHz to 900 MHz.

Operationally, the dual input LNA 200 further includes a large resistor $R_{BIAS}$ for providing a drive current for $Q_1$ at the base 207. Due to the high resistor value, $R_{BIAS}$ does not have any impact on the series resonant circuit 208. Further, $C_5$ is used for grounding AC signal energy of the spurious frequency components at the base for optimizing the linearity of the dual input LNA 200.

According to some of the other embodiments, the dual input LNA may include a FET with a gate, a drain and a source. For the FET, the gate provides the first input and the source provides the second input. The series resonant circuit AC grounds the gate and as a result, the first input sees a common source configuration and the second input sees a common gate configuration. Both common source and common gate configurations operate simultaneously to provide a common output at the drain. Additionally, the RL circuit is coupled to the drain. Hence, the FET operates as a common source amplifier for the first signal at the gate and as a common gate amplifier for the second signal at the source causing the FET to produce the output signal at the drain. Hence, the FET operates as a switchless device which simultaneously amplifies and combines inputs at the gate and the source to produce the common output at the drain.

Figure 3:
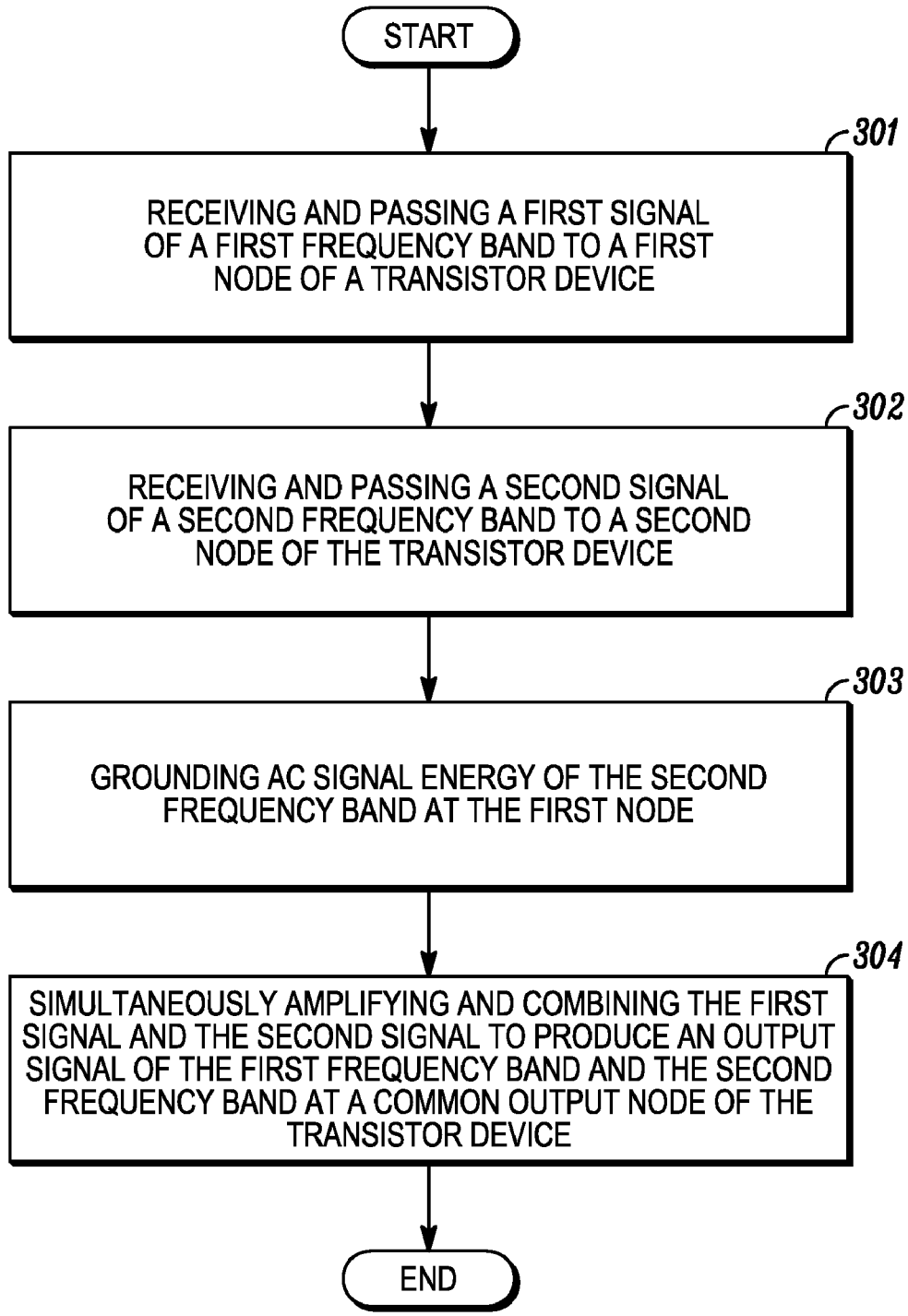
FIG. 3 is a flow chart of method for operating the dual input LNA in accordance with some embodiments of the invention.

FIG. 3 is a flow chart of operating the dual input LNA 100 in accordance with some embodiments of the invention. The method 300 is initialized in simultaneous steps 301 and 302. Step 301 includes receiving and passing the first signal of the first frequency band to the first node of the transistor device. The step of receiving and passing the first signal involves operating the first matching network in the first frequency band so as to provide input impedance matching and optimum noise matching across the first frequency band. Simultaneously, step 302 includes receiving and passing the second signal of a second frequency band to a second node of the transistor device. The step of receiving and passing the second signal involves simultaneously operating the second matching network in the second frequency band so as to provide input impedance matching and optimum noise matching across the second frequency band.

Subsequent to receiving and passing the first and the second signals, step 303 includes grounding AC signal energy of the second frequency band at the first node. The step 303 of grounding the AC signal energy of the second frequency band involves resonating the series resonant circuit at the resonant frequency within the second frequency band. Hence, the transistor device is configured to simultaneously operate in the common node amplifier configurations at the first and the second nodes. As a result of the step 303, in step 304, the method 300 includes simultaneously amplifying and combining the first signal and the second signal to produce an output signal of the first frequency band and the second frequency band at the common output node of the transistor device. The step 304 of simultaneously amplifying and combining involves switchlessly combining and amplifying the inputs at the first node and the second node to produce the output signal at the common output node. Additionally, the method 300 may also include a step of bypassing the undesired low frequency products resulting from driving multiple RF signals into a non-linear device for linearizing gain of the dual input LNA 100.

Figure 4:
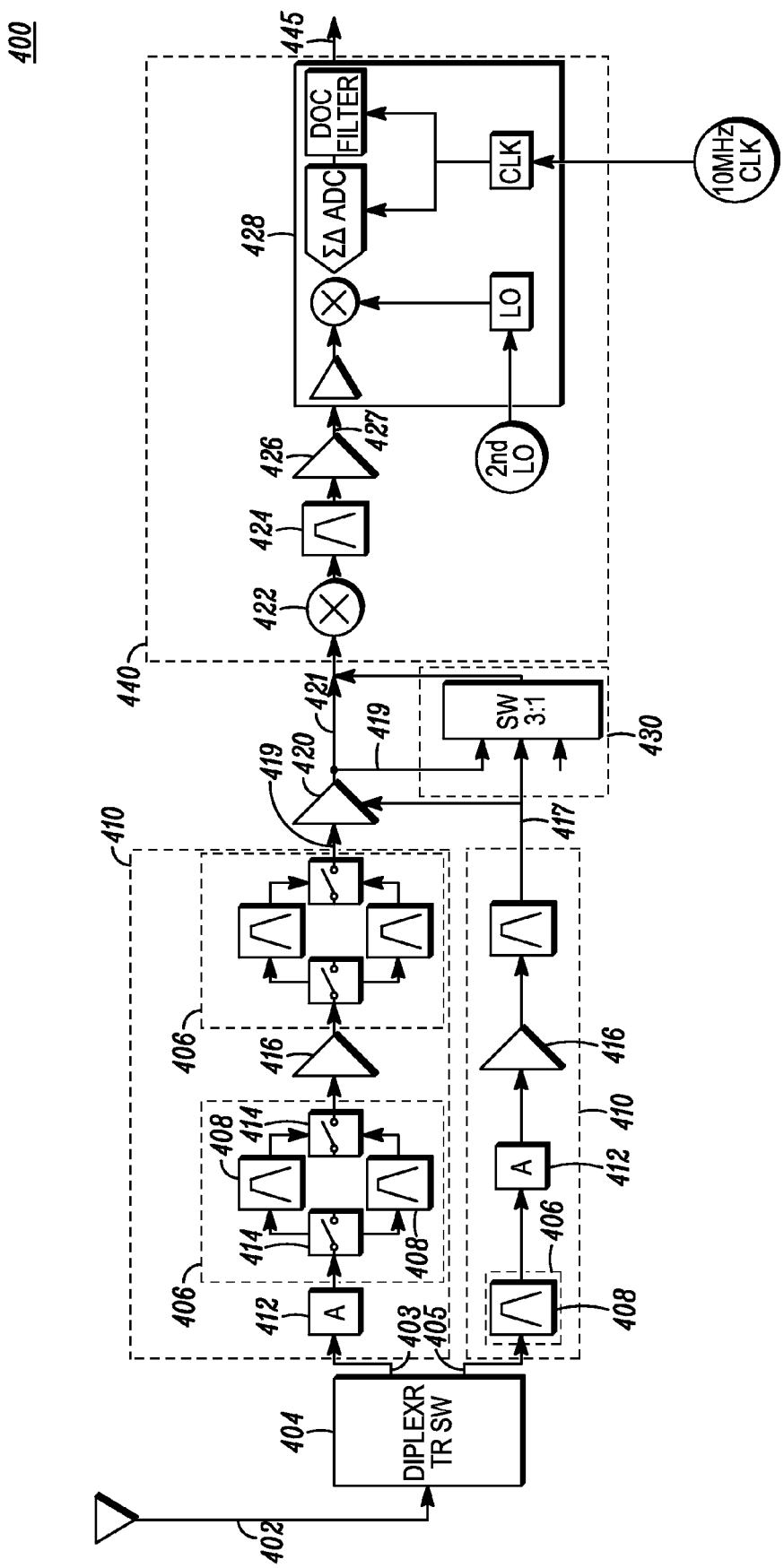
FIG. 4 is a block diagram illustrating a front-end receiver utilizing the dual input LNA in accordance with some embodiments of the invention.

FIG. 4 is a block diagram illustrating a front-end receiver 400 utilizing the dual input LNA in accordance with some embodiments of the invention. The front-end receiver 400 includes preselector blocks 410 for bandlimiting the received signal. In the illustrated embodiment, two separate preselector blocks 410 provide two filtered signals of different frequency bands, typically RF signals, to the dual input LNA 420. The dual input LNA 420 is used for amplifying and switchlessly combining two filtered signals 417 and 419 received from the preselector blocks 410 to provide a dual-band output signal 421 to a demodulator block 440. The demodulator block 440 down converts and subsequently digitizes dual-band signal 421 to provide an output 445 for digital demodulation (not shown).

An antenna 402 receives RF signals and passes these signals to a DIPLEXR block 404. The DIPLEXR block 404 subsequently passes signals 403 and 405 to the two separate preselector blocks 410. Each of the preselector blocks 410 filters the signals 403 and 405 using at least one filtering stage 406 designed for a different frequency band. As illustrated, each of the separate preselector blocks 410 may use several identical filtering stages 406 cascaded in series to remove the spurious frequency components and imaging effects from the signals 403 and 405.

Subsequently, the dual input LNA 420 simultaneously amplifies and combines the filtered signals 417 and 419 to provide the dual-band signal 421. The use of the dual input LNA 420 eliminates the requirement for a band select switch 430 currently used in the multi-band receivers. The dual-band signal 421 is provided to the demodulator block 440. In the demodulator block 440, the signal 421 is down converted to an intermediate frequency (IF) by the mixer 422 and is subsequently bandlimited to the IF band and amplified using a bandpass filter 424 and an amplifier 426. The signal 427 is subsequently digitized using a digitizer block 428 and the digitized output 445 is provided to the digital demodulation block (not shown).

According to some of the embodiments, each of the filtering stages 406 may comprise a bandpass filter 408 for bandlimiting the signals 405 and 403 to a particular frequency band. In some of the other embodiments, each of the filtering stages 406 may comprise at least two bandpass filters 408 cascaded in parallel for selectively switching, using switches 414, between different frequency bands. However, any combination of the above-mentioned filtering stages 406 may be used in the preselector blocks 410. For instance, in the illustrated embodiment, the filtering stages 406 for filtering the signal 403 utilizes two parallel connected filters 408 and switches 414. Simultaneously, the filtering stage 406 for filtering the signal 405 utilizes a single filter 408.

In some of the other embodiments, the receiver may include a first preselector block generating a first filtered signal of the first frequency band from a received signal, a second preselector block generating a second filtered signal of the second frequency band from the received signal, and a dual input LNA for amplifying and switchlessly combining the first filtered signal and the second filtered signal to provide a dual-band output signal to the demodulator block.

Although not shown, several dual input LNAs may be utilized in a multi-band receiver. The multi-band receiver may include a plurality of dual input LNAs wherein each of the plurality of dual input LNAs amplifies and switchlessly combines two filtered signals received from separate preselector blocks to provide a dual-band output signal. Such multi-band receiver may also include at least one combiner which combines each of the dual-band output signals from the plurality of dual input LNAs to provide a multi-band output to the demodulator block. While combiners may be required for the multi-band receiver, the need for switching in such a multi-band receiver is reduced by half in comparison to the conventional multi-band receivers.

Further, it will be understood by a person skilled in the art that the demodulator block 440 is shown only for illustrative purposes and it may be implemented using other demodulator architectures. In some of the embodiments, a digital processor may be used to perform the task of down converting and digitizing the signal 421 from the dual input LNA 420.

Besides combining the two filtered signals in the front-end receiver, the dual input LNA is also designed to provide an optimal gain, a desired noise factor and a reduced return loss at the desired frequency bands to improve the receiver performance. Furthermore, as different ports of a single transistor device are used for the inputs and the common output, the dual input LNA also achieves desired isolation between the input and output ports.

FIGS. 5, 6, 7 and 8 are example graphs of simulated values for the dual input LNA 200 in accordance with some embodiments of the invention. The schematic and graphs are provided as a visualization of improvement in simulated values achievable with the dual input LNA formed in accordance with some of the embodiments. In the simulation, the first signal of 800 MHz frequency band is provided at the base as an input for the common emitter configuration and the second signal of a 150-200 MHz frequency band is provided at the emitter as an input for the common base configuration. The matching networks of the dual input LNA 200 are designed to provide input impedance match and optimum noise match for the first signal and the second signal.

Figure 5:
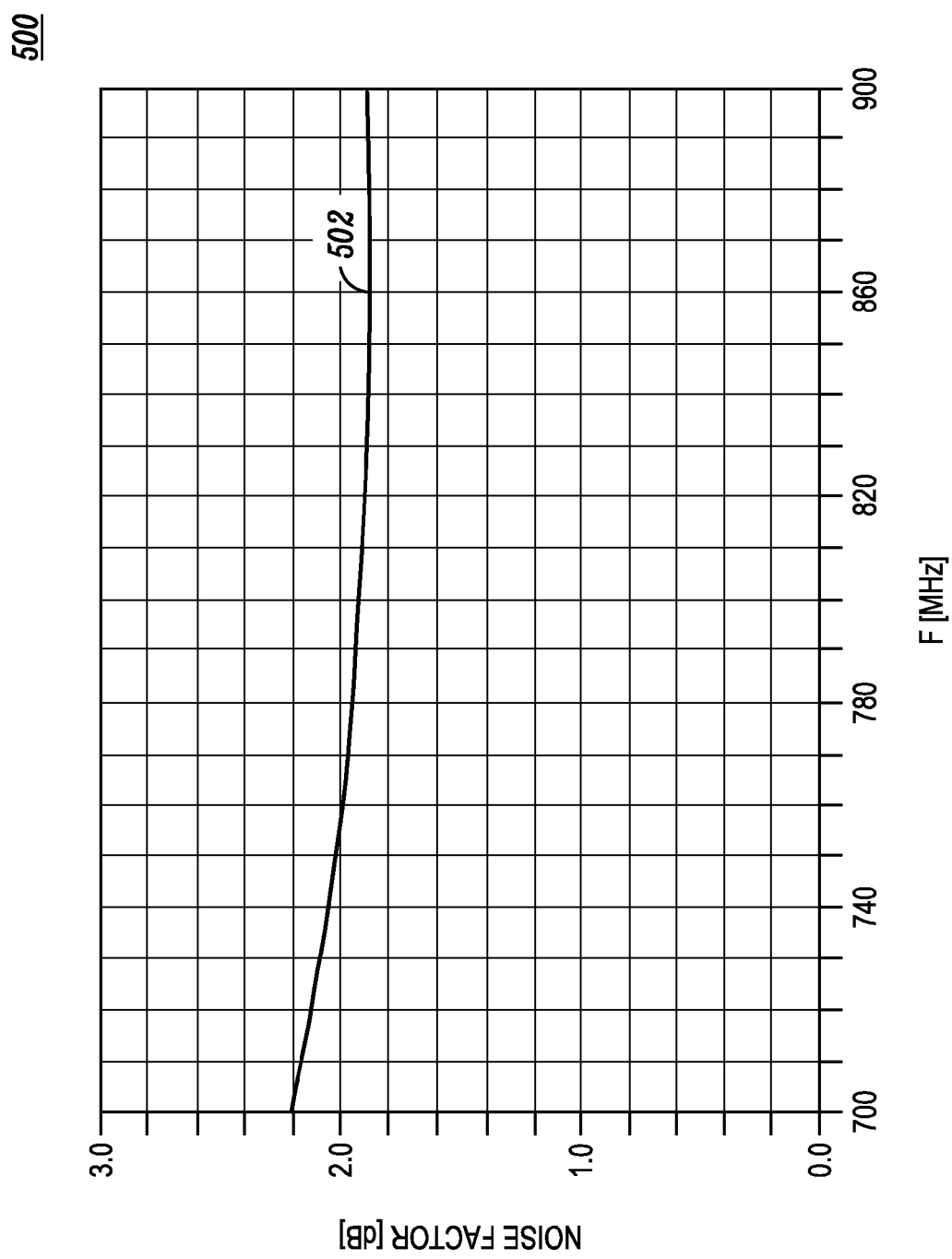
FIG. 5 is an example of a graph of simulated noise factor for the dual input LNA in accordance with some embodiments of the invention.

FIG. 5 is an example of a graph 500 of simulated noise factor for the dual input LNA 200 in accordance with some embodiments of the invention. The graph 500 represents the noise factor in decibels (dB) (also known as noise figure) along the y-axis and the frequency of the input in MHz along the x-axis. Curve 502 illustrates simulated noise factor values over a range of frequency for the dual input LNA operating in the common emitter configuration. As illustrated, the simulated noise factor value of under 2 dB is observed for the first signal of the frequency band at around 800 MHz. Hence, the simulated values indicate optimum noise match for the first matching network for the frequency band at around 800 MHz.

Figure 6:
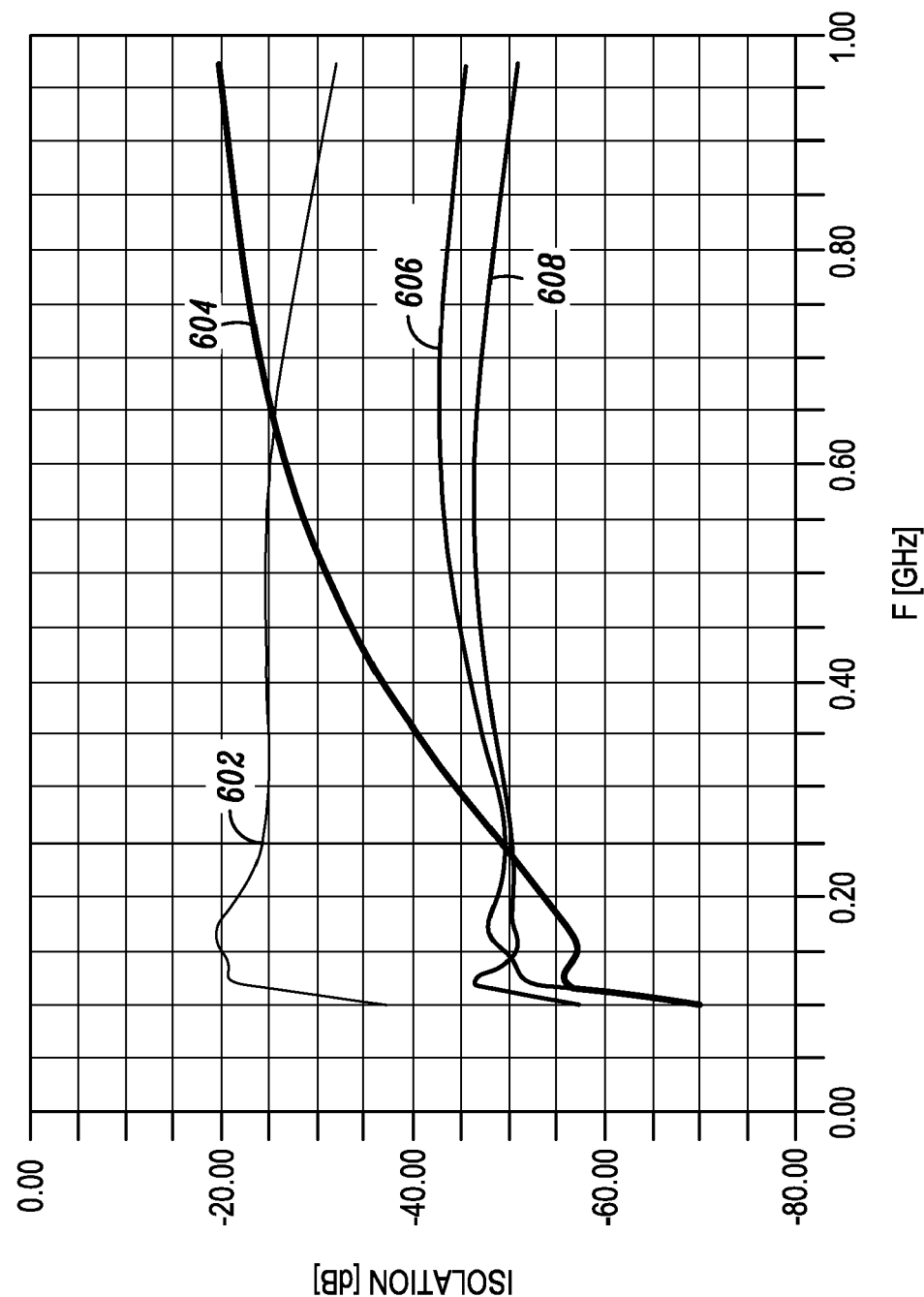
FIG. 6 is an example of a graph of simulated isolation values between ports of the dual input LNA in accordance with some embodiments of the invention.

FIG. 6 is an example of a graph 600 of simulated isolation values between ports of the dual input LNA 200 in accordance with some embodiments of the invention. The graph 600 represents the isolation in dB along the y-axis and the frequency of the input in GHz along the x-axis. As the matching networks do not introduce a significant amount of noise, the simulated isolation values for the transistor device and the dual input LNA are identical. Hence, curves of the graph 600 show the simulated isolation values representing the amount of the signal leaking from one port of the transistor device to the other port of the transistor device over a range of input frequency.

For input ports, curve 602 represents the simulated values for isolation of the emitter (the input port for the second signal) from the base (the input port for the first signal) and curve 606 represents the simulated values for isolation of the base from the emitter. Similarly, curve 604 represents the simulated values for isolation of the base from the collector (the common output port) and curve 608 represents the simulated values for isolation of the emitter from the collector. As illustrated, the dual input LNA offers better than 20 dB isolation between all ports and, specifically, better than 40 dB for the input ports over the desired frequency bands of the first and the second signals. Hence, the isolation characteristics of the dual input LNA eliminate the requirement for use of isolation filters while designing the LNAs.

Figure 7:
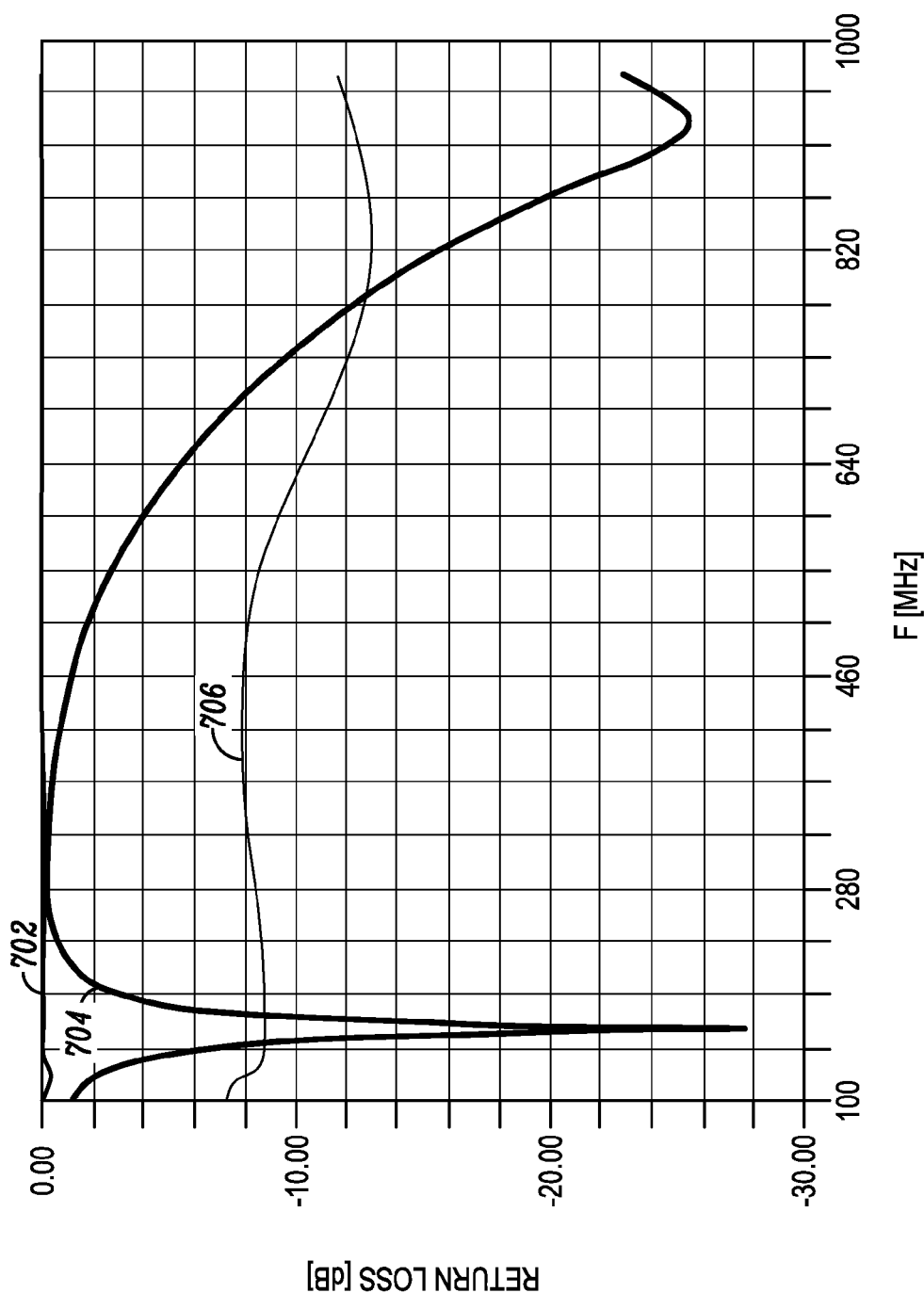
FIG. 7 is an example of a graph of simulated return loss values for ports of the dual input LNA in accordance with some embodiments of the invention.

FIG. 7 is an example of a graph 700 of simulated return loss values for ports of the dual input LNA 200 in accordance with some embodiments of the invention. The graph 700 represents the return loss values in dB along the y-axis and the frequency of the input in GHz along the x-axis. The return loss values may be used as an indicator for the input impedance match for the first and the second matching networks as the return loss value represents the ratio of the power of the reflected signal to the power of the input signal. Hence, a low return loss value for the matching networks at a particular frequency represents good input impedance match.

Curve 702 represents the simulated return loss values for the first matching network with the input seeing the common emitter configuration at the base. Curve 702 shows a return loss of below −20 dB for the desired frequency band above 800 MHz. Similarly, curve 704 represents the simulated return loss values for the second matching network with the input seeing the common base configuration at the emitter. Curve 704 shows a return loss of about −28 dB for the desired frequency band around 150 MHz. For the output impedance matching, curve 706 shows stable return loss values of about −10 dB is observed. The stable return loss is an indicator of stable output impedance due to the resistive loading of the collector by the series RL circuit. Hence, while the return loss values for the collector are not low, the series RL circuit does provide stable output impedance at the collector over a wide frequency band.

Figure 8:
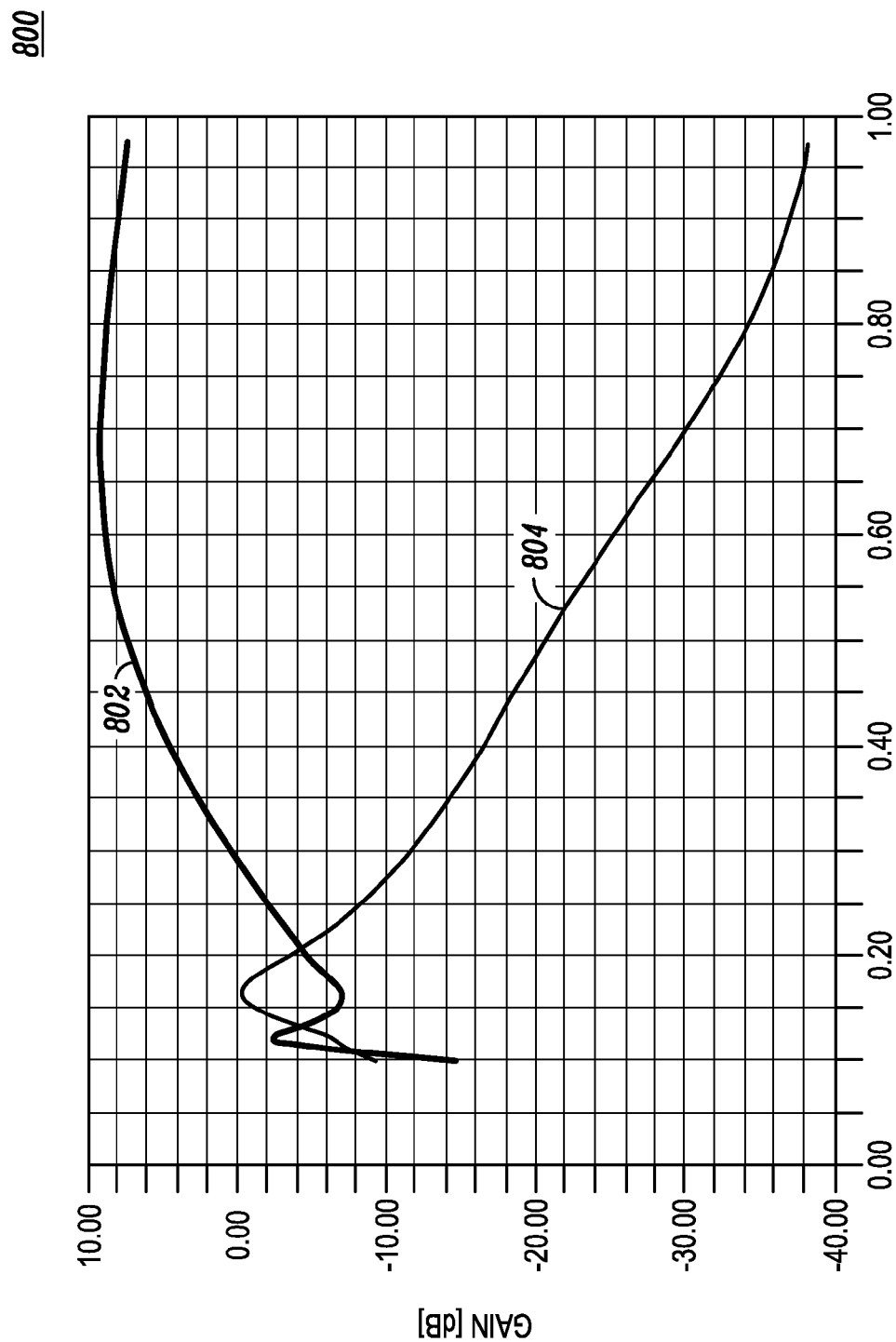
FIG. 8 is an example of a graph of simulated gain values for different amplifier configurations of the dual input LNA in accordance with some embodiments of the invention.

FIG. 8 is an example of a graph 800 of simulated gain values for different amplifier configurations of the dual input LNA 200 in accordance with some embodiments of the invention. The graph 800 represents the gain values in dB along the y-axis and the frequency of the input in GHz along the x-axis. Curve 802 represents the simulated gain values for the common emitter configuration at the base and curve 804 represents the simulated gain values for the common base configuration at the emitter. The curve 802 shows maximum gain of about 10 dB for the common emitter configuration at the desired frequency band of around 800 MHz. Simultaneously, the curve 804 shows maximum gain of about 0 dB for the common base configuration at the desired frequency band of around 150-200 MHz. Hence, the dual input LNA is configured to simultaneously operate in the two different amplifier configurations to provide the desired gain for inputs, of the desired frequency bands, at the base and the emitter.

Hence, there has been provided a dual input LNA particularly useful in the multi-band receivers. The dual input LNA of the present invention avoids the use of band select switches and thus, achieves a power efficient and robust design for the multi-band receivers. By utilizing a series resonant circuit in the dual input LNA, simultaneous amplifier configuration for two inputs is provided to produce a common output. Hence, by utilizing the dual input LNA of the present invention, the problems associated with switching are avoided. Additionally, input impedance and optimal noise match for the two inputs is achieved. Furthermore, the use of a single transistor device in the dual input LNA significantly improves isolation between various nodes of the dual input LNA.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The invention claimed is:

1. A dual input low noise amplifier (LNA) comprising:
a transistor device;
a first circuit configured for receiving and passing a first signal of a first frequency band to a first node (Base or Gate) of the transistor device;
a second circuit configured for receiving and passing a second signal of a second frequency band to a second node (Emitter or Source) of the transistor device; and
a series resonant circuit coupled between the first node of the transistor device and a ground thereby effectively and exclusively grounding alternating current (AC) signal energy of the second frequency band and causing the transistor device to simultaneously amplify and combine the first signal and the second signal to produce an output signal of the first frequency band and the second frequency band at a common output node of the transistor device.

2. The dual input LNA of claim 1 further comprising a series resistor inductor (RL) circuit coupled between a biasing source and the common output node of the transistor device for providing stable output impedance over a frequency range for the output signal.

3. The dual input LNA of claim 1, wherein the first circuit is a first matching network configured to provide an input impedance match and an optimum noise match for an input signal of the first frequency band and wherein the second circuit is a second matching network configured to simultaneously provide the input impedance match and the optimum noise match for an input signal of the second frequency band.

4. The dual input LNA of claim 1, wherein the series resonant circuit is a series inductor capacitor (LC) resonant circuit configured to have a resonant frequency within the second frequency band.

5. The dual input LNA of claim 4 further comprising a bypass capacitor coupled between a common node of a capacitor and an inductor in the series LC resonant circuit and the ground for optimizing linearity of the dual input LNA.

6. The dual input LNA of claim 5 further comprising a bias resistor coupled between the common node and a biasing source for providing a drive current at the first node.

7. The dual input LNA of claim 1, wherein the transistor device is one of: a bipolar junction transistor (BJT) and a field effect transistor (FET).

8. The dual input LNA of claim 1, wherein the transistor device is one of: a N-type device and a P-type device.

9. The dual input LNA of claim 7, wherein the transistor device is a switchless device which simultaneously amplifies and combines inputs at the first node and the second node to produce the output signal at the common output node.

10. The dual input LNA of claim 9, wherein the BJT operates as a common emitter amplifier for the first signal at the first node and as a common base amplifier for the second signal at the second node causing the BJT to produce the output signal at the common output node.

11. The dual input LNA of claim 9, wherein the FET operates as a common source amplifier for the first signal at the first node and as a common gate amplifier for the second signal at the second node causing the FET to produce the output signal at the common output node.

12. A method of operating a dual input low noise amplifier (LNA) comprising:
receiving and passing a first signal of a first frequency band to a first node of a transistor device;
receiving and passing a second signal of a second frequency band to a second node of the transistor device;
grounding AC signal energy of the second frequency band at the first node; and
simultaneously amplifying and combining the first signal and the second signal to produce an output signal of the first frequency band and the second frequency band at an common output node of the transistor device.

13. The method of claim 12, wherein the receiving and passing the first signal further comprises operating a first circuit in the first frequency band so as to provide input impedance matching and optimum noise matching across the first frequency band and wherein the receiving and passing the second signal further comprises simultaneously operating a second circuit in the second frequency band so as to provide input impedance matching and optimum noise matching across the second frequency band.

14. The method of claim 12, wherein grounding AC signal energy of the second frequency band further comprises resonating a series resonant circuit for a resonant frequency within the second frequency band.

15. The method of claim 12, further comprising bypassing undesired frequency bands received as inputs at the first node and the second node for linearizing gain of the dual input LNA.

16. The method of claim 12, wherein the simultaneously amplifying and combining further comprises switchlessly combining and amplifying inputs at the first node and the second node to produce the output signal at the common output node.

17. A dual-band receiver including:
a dual input low noise amplifier (LNA) amplifying and switchlessly combining two filtered signals received from separate preselector blocks to provide a dual-band output signal to a demodulator block, each of the separate preselector blocks comprising at least one filtering stage providing one of the two filtered signals, each of the at least one filtering stage cascaded in series, the at least one filtering stage of at least one of the separate preselector blocks further comprising at least two filters coupled in parallel for selectively switching to a different frequency band for the two filtered signals.

18. A dual-band receiver comprising:
a first preselector block generating a first filtered signal of a first frequency band from a received signal;
a second preselector block generating a second filtered signal of a second frequency band from the received signal; and
a dual input low noise amplifier (LNA) for amplifying and switchlessly combining the first filtered signal and the second filtered signal to provide a dual-band output signal to a demodulator block, the first and the second preselector blocks comprising at least one filtering stage providing the first and the second filtered signal, each of the at least one filtering stages cascaded in series, the at least one filtering stage of the first preselector block further comprising at least two filters coupled in parallel for selectively switching to a different frequency band.

19. A multi-band receiver comprising:
a plurality of dual input low noise amplifiers (LNAs);
wherein each of the plurality of dual input LNAs amplifies and switchlessly combines two filtered signals received from separate preselector blocks to provide a dual-band output signal; and
wherein at least one combiner combines each of the dual-band output signals to provide a multi-band output to a demodulator block, each of the separate preselector blocks comprising at least one filtering stage providing one of the two filtered signals, each of the at least one filtering stages cascaded in series, the at least one filtering stage of at least one of the separate preselector blocks further comprising at least two filters coupled in parallel for selectively switching to a different frequency band for the two filtered signals.

20. A low noise amplifier (LNA), comprising:
a bipolar junction device (BJT) having a base, a emitter and a collector, the base providing a first input and the emitter providing a second input;
the first input seeing a common emitter configuration;
the second input seeing a common base configuration, both common emitter and common base configurations operating simultaneously;
a series resonant circuit AC grounding the base;
a broadband biasing circuit coupled to the collector; and
a common output taken from the collector.

21. The LNA of claim 20, wherein the broadband biasing circuit comprises a series resistor inductor (RL) circuit.

22. A low noise amplifier (LNA), comprising:
a field effect transistor (FET) having a gate, a drain and a source, the gate providing a first input and the source providing a second input;
the first input seeing a common source configuration;
the second input seeing a common gate configuration, both common source and common gate configurations operating simultaneously;
a series resonant circuit AC grounding the gate;
a broadband biasing circuit coupled to the drain; and
a common output taken from the drain.

23. The LNA of claim 22, wherein the broadband biasing circuit comprises a series resistor inductor (RL) circuit.

* * * * *